(12) United States Patent
Lee

(10) Patent No.: US 7,005,312 B2
(45) Date of Patent: *Feb. 28, 2006

(54) METHOD OF MANUFACTURING CMOS IMAGE SENSOR BY MEANS OF DOUBLE MASKING PROCESS

(75) Inventor: Won-Ho Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 3 days.

This patent is subject to a terminal disclaimer.

(21) Appl. No.: 10/746,044

(22) Filed: Dec. 23, 2003

(65) Prior Publication Data

US 2004/0219708 A1    Nov. 4, 2004

(30) Foreign Application Priority Data

Apr. 29, 2003   (KR) ...................... 10-2003-0026970

(51) Int. Cl.
*H01L 21/00* (2006.01)
(52) U.S. Cl. .............................. 438/29; 438/40; 257/53
(58) Field of Classification Search ................. 438/29, 438/40
See application file for complete search history.

(56) References Cited

U.S. PATENT DOCUMENTS

| | | | | |
|---|---|---|---|---|
| 6,307,214 B1 * | 10/2001 | Ohtani et al. | .................. | 257/59 |
| 6,642,076 B1 * | 11/2003 | Yaung et al. | .................. | 438/48 |
| 6,716,732 B1 * | 4/2004 | Park et al. | .................. | 438/586 |
| 6,737,291 B1 * | 5/2004 | Lim | ........................... | 438/45 |
| 2004/0082154 A1 * | 4/2004 | Lim | ........................... | 438/592 |
| 2004/0219709 A1 * | 11/2004 | Lee | ............................. | 438/57 |

* cited by examiner

Primary Examiner—W. David Coleman
(74) Attorney, Agent, or Firm—Blakely Sokoloff Taylor & Zafman

(57) ABSTRACT

The method for manufacturing a CMOS image sensor is employed to pattern uniformly an overlying layer on a gate structure regardless of a gate width. The method includes steps of: preparing a semiconductor substrate by a predetermined process where a pixel area, a peripheral area and an input/output (I/O) area are defined by FOX therebetween; forming a first, a second and a third gate structures in the pixel, the peripheral and the I/O areas, respectively; forming a salicide barrier layer and a BARC layer over the resultant structure in sequence; forming a first photoresist mask on the BARC layer in the I/O area; carrying out a first etchback process by using the first photoresist mask as an etch mask; forming a second photoresist mask on the BARC layer in the pixel area; carrying out a second etchback process by using the second photoresist mask as the etch mask; and carrying out a third etchback process so as to expose top faces of the first and the second gate structures.

10 Claims, 2 Drawing Sheets

METHOD OF MANUFACTURING CMOS IMAGE SENSOR BY MEANS OF DOUBLE MASKING PROCESS

FIELD OF THE INVENTION

The present invention relates to a method for manufacturing a semiconductor device; and, more particularly, to a method for manufacturing a complementary metal oxide semiconductor (CMOS) image sensor with a high reliability.

DESCRIPTION OF THE PRIOR ART

A complementary metal oxide semiconductor (CMOS) image sensor is a device that converts an optical image to an electrical signal using a CMOS manufacturing technology, which employs a switching scheme of an MOS transistor for transportation of photo-electric charges from a photodiode to an output node as well as detection of an output signal at the output node.

In general, a unit pixel in CMOS image sensor includes one photodiode (PD) and four NMOS transistors. The four transistors include a transfer transistor for transferring the photo-electric charges generated from the photodiode to a floating sensing node, a reset transistor for discharging the charges stored in the floating sensing node to detect subsequent signals, a drive transistor serving as a source follower, and a selection transistor for switching and addressing.

In manufacturing the CMOS image sensor, there is employed a salicide (self-aligned silicide) layer for improving an operation speed. In particular, when the gate electrode is a polysilicon, a salicide layer is preferably formed on the gate electrode and the source/drain region in order to lower the sheet resistance. For instance, the salicide layer, such as titanium silicide or the like, is formed with a refractory metal by a salicide process. Herein, the salicide layer is formed on a gate structure and a source/drain region in predetermined locations of an active area. That is, the salicide layer is formed on the gate and the source/drain region in a peripheral area and is also formed on the gate in the pixel area. However, in an input/output (I/O) area, there is no salicide layer because the I/O area requires a high resistance.

The conventional method for forming the salicide will be illustrated in brief hereinafter.

To begin with, a semiconductor in which an active area and a field oxide (FOX) are defined is prepared by a predetermined process. Thereafter, a plurality of gate structures having gate electrodes and gate insulators are formed on predetermined locations of the semiconductor substrate, e.g., a pixel area, a peripheral area, an I/O area and so forth. Afterward, a salicide barrier layer and a bottom anti-reflective coating (BARC) layer are formed on the semiconductor substrate, wherein the BARC layer embraces the gate structures. Subsequently, a photoresist mask is formed over the pixel area and the I/O area by a typical forming method. In an ensuing step, the BARC layer and the salicide layer are etched in sequence by means of an etchback process till a top face of the gate electrode is exposed. Following the etchback process, a salicide process is carried out in order to form the salicide layer on desired layers such as the gate electrode and the source/drain region in the active area of the semiconductor substrate.

In the conventional method, as described above, there is employed single masking process for patterning the BARC layer and the salicide barrier layer before the salicide process. However, the conventional method using the single masking process suffers from shortcomings that the BARC layer is not etched uniformly during the etchback process because the underlying gates have different gate widths. That is, provided that the underlying gate is broad, the BARC layer is hardly etched so that the top face of the underlying gate is not completely exposed. That is, the gate electrode is not opened after carrying out the etchback process when the gate width is relatively large. Therefore, it is difficult to form the salicide on desired layers, i.e., the gate, to thereby deteriorate the CMOS image sensor characteristic and degrade a reliability of the CMOS image sensor after all. Accordingly, it is necessary to develop a technique for uniformly patterning the overlying layer formed over the gate regardless of the gate width.

SUMMARY OF THE INVENTION

It is, therefore, an object of the present invention to provide a method for manufacturing a complementary metal oxide semiconductor (CMOS) image sensor in order to pattern an overlying layer on a gate structure uniformly regardless of a gate width by employing a double masking process.

In accordance with one aspect of the present invention, there is provided method for manufacturing a CMOS image sensor, including: a) preparing a semiconductor substrate structure having gate stacks, a salicide barrier layer and a bottom anti-reflective coating (BARC) layer sequentially formed on a substrate, the substrate having a pixel area and a peripheral area; b) carrying out a first etchback process, to thereby expose the salicide barrier layer in the pixel area; c) carrying out a second etchback process, to thereby expose the salicide barrier layer in the peripheral area; and d) carrying out a third etchback process, to thereby expose top surfaces of the gate stacks in the pixel area and the peripheral area.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 1A to 1D cross sectional views setting forth a method for manufacturing a complementary metal oxide semiconductor (CMOS) image sensor in accordance with a preferred embodiment of the present invention.

Figure 1A:
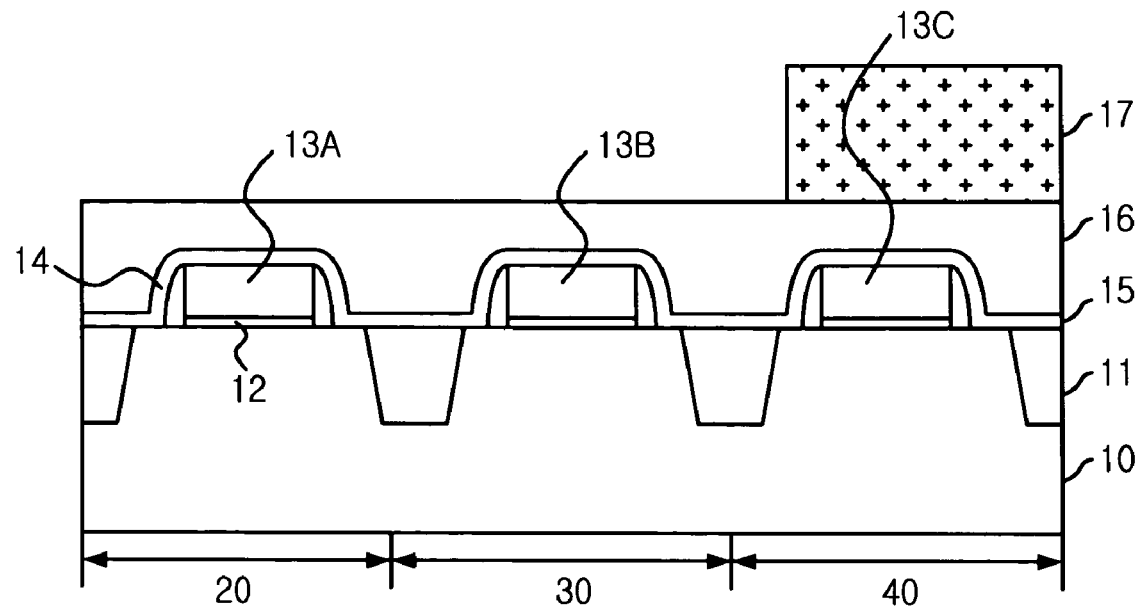
FIGS. 1A to 1D are cross sectional views setting forth a conventional complementary metal oxide semiconductor (CMOS) image sensor by employing a double masking process.

Referring to FIG. 1A, an inventive method for manufacturing the CMOS image sensor begins with preparing a semiconductor substrate 10 by a predetermined process in which a pixel area 20, a peripheral area 30 and an input/output (I/O) area 40 are defined. Thereafter, a gate insulting layer and a conductive layer such as a polysilicon are formed on the semiconductor substrate 10 in sequence and are patterned into a predetermined configuration, thereby forming a first gate electrode 13A, a second gate electrode 13B and a third gate electrode 13C and also forming gate insulators 12 in each area 20, 30 and 40. Afterward, an insulating layer is formed over the resultant structure and is anisotropically etched to form spacers 14 on the first, the second and the third gate electrodes 13A, 13B and 13C. Herein, the second gate electrode 13B in the peripheral area 30 is relatively wider than the first gate electrode 13A in the pixel area 20.

Following the formation of the gate structure, a salicide barrier layer 15 is formed over the resultant structure with a thickness in a range of about 600 Å to about 700 Å. In an ensuing step, a bottom anti-reflective coating (BARC) layer 16 is formed on the salicide barrier layer 15, wherein the BARC layer 16 completely embraces the gate structures. Here, the salicide barrier layer 15 uses a material such as a high temperature low pressure deposition (HLD) oxide, an $O_3$-undoped silicate glass (USG) or the like. It is noted that the thickness of the BARC layer 16 should be determined in consideration of the thickness of a remaining BARC layer 16 in the I/O area 40 after a post second etchback process. That is, the remaining BARC layer 16 should be thicker than the height of the gate structure in the I/O area 40 after carrying out the second etchback process.

Following the formation of the BARC layer 16, a curing process such as a hard bake or a ultra-violet (UV) bake is carried out for hardening the BARC layer 16. Afterward, a first photoresist mask 17 is formed on a planarized surface of the BARC layer 16 within the I/O area 40. In the present invention, the first photoresist mask 17 is formed only over the I/O area 40, while the photoresist masks are formed over the pixel area 20 and the I/O area 40 in the conventional method.

Figure 1B:
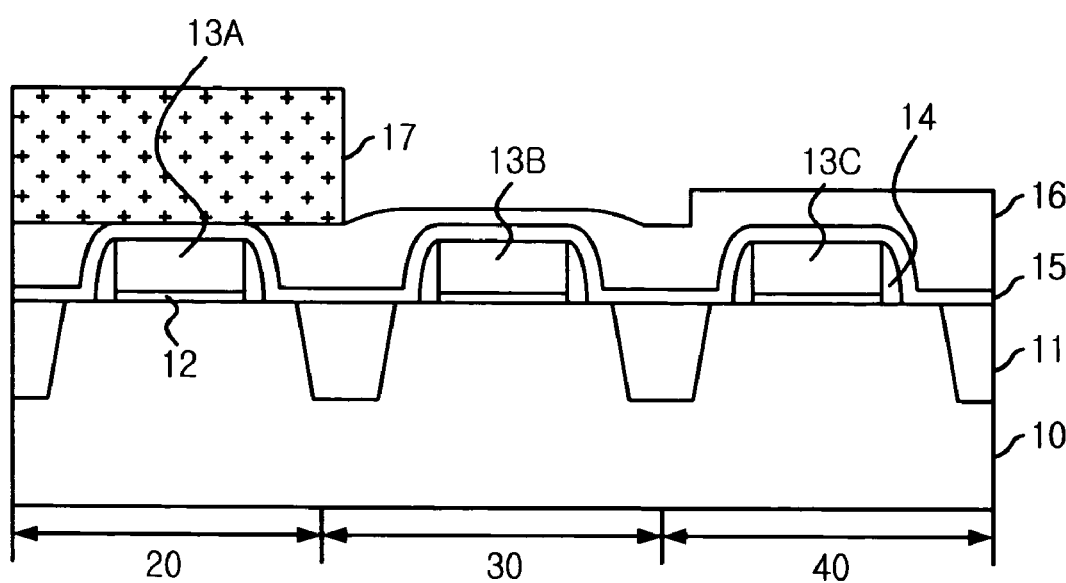

In a subsequent step, referring to FIG. 1B, a first etchback process is carried out by using the first photoresist mask 17 as an etch mask in order to expose the top face of the salicide barrier layer 12 in the pixel area 20. Herein, since the second gate 13B in the peripheral area 30 is a relatively wider, the BARC layer 16 is not completely etched so that predetermined portion of the BARC layer 16 still remains on the salicide barrier layer 16 over the second gate 13B in the peripheral area 30. Thereafter, the first photoresist mask 17 is removed by a typical method such as a photostrip process. Afterward, a second photoresist mask 18 using a conventional n-channel stop reticle and a negative photoresist is formed over the pixel area 20 for preventing the source/drain region in the pixel area 20 being exposed during the post etchback process.

Figure 1C:
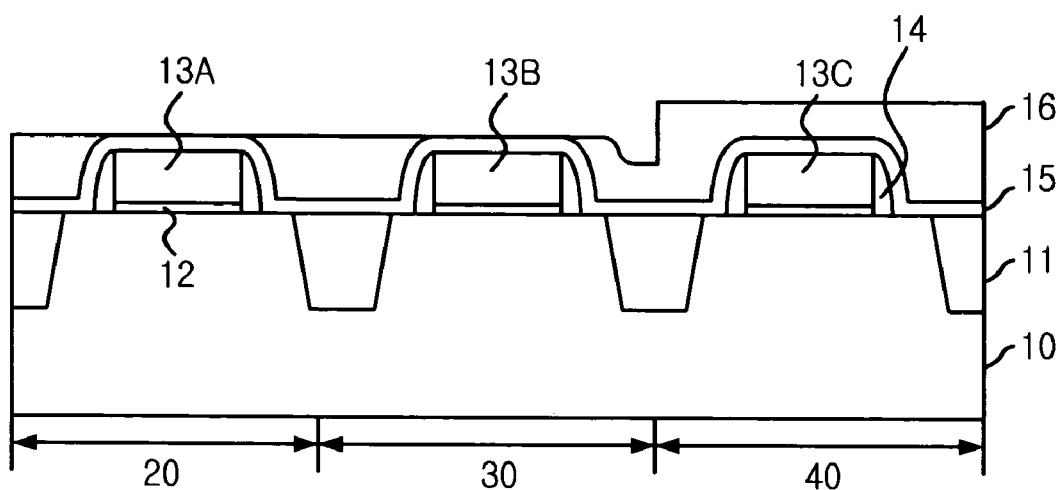

Thereafter, referring to FIG. 1C, a second etchback process is carried out to etch the BARC layer 16 by using the second photoresist mask 18 as the etch mask till the salicide barrier layer 15 in the peripheral area 30 is exposed. Meanwhile, the BARC layer 16 disposed over the I/O area 40 does not experience the first etchback process so that the thickness of the BARC layer 16 in the I/O layer is left intact before the second etch back process. Therefore, in the I/O area 40, the portion of the BARC layer 16 still remains over the third gate electrode 13C after the second etchback process because the second etchback process is carried out until the salicide in the peripheral area 30 is exposed. Afterward, the second photoresist mask 18 is removed by the typical method such as the photostrip process.

Figure 1D:
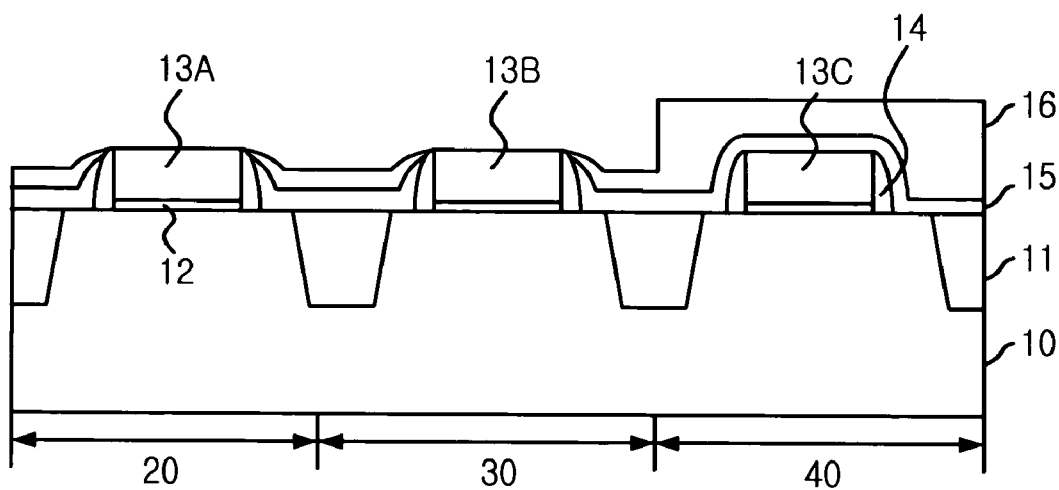
Figure 1A:
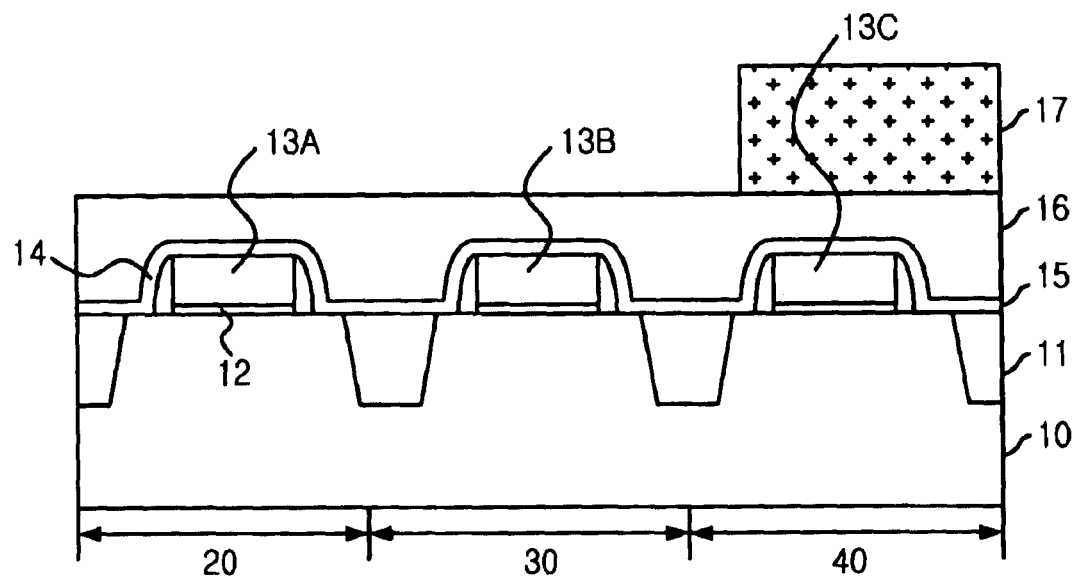
Figure 1B:
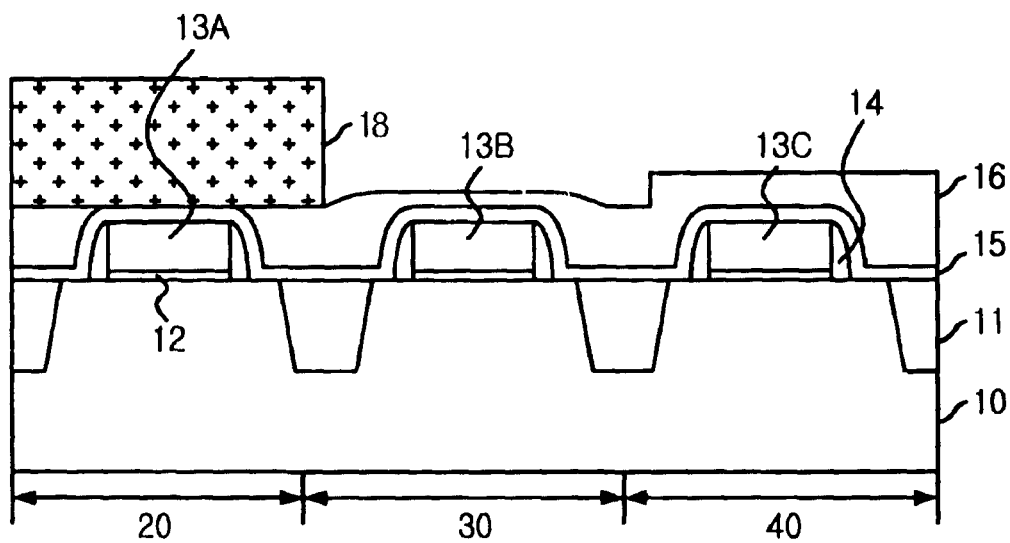

Subsequently, referring to FIG. 1D, the salicide barrier layer 15 on the first gate electrode 13A and the second gate electrode 13B is removed by means of a third etchback process, thereby exposing the top faces of the first and the second gate electrodes 13A and 13B. During the third etchback process, the BARC layer 16 over the third gate 13C is not completely etched, whereby a residual BARC layer 16 still remains on the third gate electrode 13C. Therefore, there is not formed a salicide layer on the third gate 13C during a subsequent salicide process, thereby securing a high resistance in the I/O area 40.

Thereafter, though it is not depicted in the drawing, a third photoresist mask is formed on portions where the salicide layer will not be formed. Subsequently, a residual BARC layer 16 and a salicide barrier layer 15 are removed by using the third photoresist mask as the etch mask. Finally, the salicide process is carried out after removing the third photoresist mask.

As described above, the present invention employs a double masking process for patterning the BARC layer 16 before carrying out the salicide process so that the BARC layer 16 is uniformly etched after the first and the second etchback processes regardless of the underlying gate width. Accordingly, it is possible to form the salicide layer on the desired gate and the source/drain region in the active area during the post salicide process and concurrently, to secure the high resistance property in the I/O area 40.

While the present invention has been described with respect to the particular embodiments, it will be apparent to those skilled in the art that various changes and modifications may be made without departing from the scope of the invention as defined in the following claims.

What is claimed is:

1. A method for manufacturing a complementary metal oxide semiconductor (CMOS) image sensor, comprising the steps of:
   a) preparing a semiconductor substrate structure having gate stacks, a salicide barrier layer and a bottom anti-reflective coating (BARC) layer sequentially formed on a substrate, the substrate having a pixel area and a peripheral area;
   b) carrying out a first etchback process, to thereby expose the salicide barrier layer in the pixel area;
   c) carrying out a second etchback process, to thereby expose the salicide barrier layer in the peripheral area; and
   d) carrying out a third etchback process, to thereby expose top surfaces of the gate stacks in the pixel area and the peripheral area.

2. The method as recited in claim 1, wherein the substrate includes an input/output (I/O) area, and the step b) includes the steps of:
   b1) forming a first photoresist mask on the BARC layer in the I/O area; and
   b2) carrying out the first etchback process by using the first photoresist mask as an etch mask till the salicide barrier layer in the pixel area is exposed.

3. The method as recited in claim 1, wherein the step c) includes the steps of:
   c1) forming a second photoresist mask on the BARC layer in the pixel area; and
   c2) carrying out a second etchback process by using the second photoresist mask as the etch mask till the salicide barrier layer in the peripheral area is exposed.

4. The method as recited in claim 1, wherein the salicide barrier layer employs a high temperature low pressure deposition (HLD) oxide or $O_3$-undoped silicate glass (USG).

5. The method as recited in claim 4, wherein the salicide barrier layer is formed with a thickness in a range of about 600 Å to about 700 Å.

6. The method as recited in claim 1, wherein the second photoresist mask uses an n-channel stop reticle and a negative photoresist.

7. The method as recited in claim 1, after the step a), further comprising the step of hardening the BARC layer.

8. The method as recited in claim 7, wherein the step of hardening the BARC layer is carried out by using a hard bake process.

9. The method as recited in claim 7, wherein the step of hardening the BARC layer is carried out by using a ultra-violet (UV) bake process.

10. The method as recited in claim 1, after the step d), further comprising the steps of:

i) forming a third photoresist mask on portions where a salicide layer is not formed;

j) etching the other portions not covered with the third photoresist mask, to expose said the other portions where the salicide layer is formed; and k) carrying out a salicide process.

* * * * *

UNITED STATES PATENT AND TRADEMARK OFFICE
CERTIFICATE OF CORRECTION

PATENT NO. : 7,005,312 B2
APPLICATION NO. : 10/746044
DATED : February 28, 2006
INVENTOR(S) : Won-Ho Lee It is certified that error appears in the above-identified patent and that said Letters Patent is hereby corrected as shown below:

Column 2, line 60, delete "insulting" and insert --insulating--.

Column 3, lines 33-34, delete "salicide barrier layer 12" and insert --salicide barrier layer 15--.

Column 3, line 38, delete "salicide barier layer 16" and insert --salicide barrier layer 15--.

Signed and Sealed this

Sixth Day of April, 2010

David J. Kappos
*Director of the United States Patent and Trademark Office*

UNITED STATES PATENT AND TRADEMARK OFFICE
CERTIFICATE OF CORRECTION

PATENT NO.        : 7,005,312 B2
APPLICATION NO.   : 10/746044
DATED             : February 28, 2006
INVENTOR(S)       : Won-Ho Lee It is certified that error appears in the above-identified patent and that said Letters Patent is hereby corrected as shown below:

Delete Drawing Sheet 1, and substitute with Drawing Sheet 1. (attached)

Signed and Sealed this

First Day of June, 2010

David J. Kappos
*Director of the United States Patent and Trademark Office*